US005932850A

United States Patent [19]

Sabato et al.

[11] Patent Number: 5,932,850

[45] Date of Patent: Aug. 3, 1999

[54] SPEAKER SYSTEM

[75] Inventors: Takashi Sabato; Toshihide Takizawa; Teruo Doi; Kazuki Honda; Takafumi Yuasa, all of Mie, Japan

[73] Assignee: Matsushita Electric Industrial Co., Ltd., Japan

[21] Appl. No.: 09/069,311

[22] Filed: Apr. 29, 1998

Related U.S. Application Data

[62] Division of application No. 08/615,868, Mar. 14, 1996, Pat. No. 5,793,000.

[30] Foreign Application Priority Data

Mar. 14, 1995 [JP] Japan .................................... 7-054425

[51] Int. Cl.$^{6}$ ...................................................... H05K 5/00

[52] U.S. Cl. ........................... 181/152; 181/182; 181/141

[58] Field of Search .................................... 181/152, 155, 181/156, 159, 160, 182, 183, 184, 190, 192, 141

[56] References Cited

U.S. PATENT DOCUMENTS 5,229,555 7/1993 Inoue et al. ............................ 181/152

5,604,337 2/1997 Sugimoto et al. ...................... 181/152

*Primary Examiner*—Khanh Dang

*Attorney, Agent, or Firm*—McDermott, Will & Emery

[57] ABSTRACT

A speaker system provides good acoustic characteristics for use in visual equipment, by controlling the turbulence in mid-range of response frequency characteristics to be flat so as to produce an excellent speech articulation. This is accomplished by coupling an acoustic pipe to the front of a speaker unit to guide sound waves through an opening of generally rectangle shape. A resonance absorption section is formed by a tube, one end of which forms a hole for absorbing sound facing to a sound path running within the acoustic pipe from the front of speaker unit to an opening, and a cavity having a small gap along the edge, except the area where is coupled through with the other end of tube. By constructing the speaker system in this way, the width of band to be absorbed and the Q of a dip can be controlled to suppress the peaks and dips, thereby providing a speaker system of good acoustic characteristics where the response frequency characteristics are flat and the speech articulation is excellent.

4 Claims, 12 Drawing Sheets

SPEAKER SYSTEM

This is a divisional of application Ser. No. 08/615,868, filed Mar. 14, 1996, now U.S. Pat. No. 5,793,000.

FIELD OF THE INVENTION

The present invention relates to a speaker system comprising an acoustic pipe for guiding a sound wave generated by a speaker disposed at the rear part of an equipment to the front among various visual appliances, such as television receivers, and audio instruments for use in the fields of automobile, information processing, communication, or the like.

BACKGROUND OF THE INVENTION

Coupling a horn or an acoustic pipe to the front of a speaker unit in order to guide a sound wave or waves generated by the speaker unit to the opening of an acoustic pipe is a method which has advantages over a case without a horn or an acoustic pipe. For example, the sound can be conveyed to a specific direction, or the output of a larger sound pressure is obtainable. Because of these features, the method has been widely used in many such applications.

FIG. 10 shows a conceptual construction of a television receiver set comprising such a speaker system. Where, the listed numerals identify the following elements: 1 denotes an acoustic pipe, 2 a speaker unit, 3 a cabinet of television set, 4 a cathode ray tube, 5 a back cabinet. Symbol "a" represents a radiation sound wave of a front side of a television set, and symbol "B" represents a radiation sound wave of a back side of television set.

With a television receiver set having the above described constitution (or construction), its operation is described hereunder. A sound wave generated by speaker unit 2 goes to an acoustic pipe 1, which is coupled to the front of the speaker unit, has an oblong shaped, approximately rectangle, opening. The entire speaker system is constructed to take a shape running along cathode ray tube 4 and cabinet 3 of television set within the inside of the television receiver. The sound wave is guided to the front through the narrow space to be radiated as the radiation sound wave of a front side "all from an opening of cabinet 3 of the television set, and at the same time a sound wave is radiated at the back of speaker unit 2 as the radiation sound wave of back side B to the inside of back cabinet 5.

The above described constitution enables one to make a television receiver set small and slim. Now in the following, the speaker system comprising the speaker unit 2 and the acoustic pipe 1 is described in detail referring to FIG. 11 and FIG. 12.

FIG. 11 shows a perspective view of prior art speaker system, and FIG. 12 a cross sectional side view of the speaker system. In these FIGURES, the listed numerals represent the following elements: 6 denotes a sound path through which a sound wave generated by speaker unit 2 proceeds, 7 a hole for absorption sound facing sound path 6, 10 a resonance absorption section comprising a tube 8 with the hole 7 as its one end and a cavity 9 which is coupled through with the other end of tube 8, and 11 an opening through which a sound wave is radiated.

With the above described constitution, the operation of a prior art speaker system is described as follows. When an input signal reaches speaker unit 2, a sound wave proceeds along the sound path 6 of the acoustic pipe 1 so as to be radiated through opening 11 of acoustic pipe 1.

In the mean time, however, because of a substantial shift in the acoustic impedance is caused at the opening 11 of the acoustic pipe 1, a part of the sound wave is reflected and returned to the sound path 6. This creates a standing wave in accordance with the length of acoustic pipe 1, which enables the response frequency characteristics to have their peak at the mid-range frequency.

In order to remove the peak in mid-range frequency caused by the standing wave, the above described prior art constitution tried to absorb the peak part with the resonance absorption section 10, which comprised the tube 8 with hole 7 facing sound path 6 at its one end and the cavity 9 coupled through with the other end of tube 8. The resonance absorption section 10 has a sealed structure except that it is coupled with tube 8.

FIGS. 13 and 14 illustrate other prior art speaker systems intended to absorb such a standing wave, with FIG. 13 showing a cross sectional side view, and FIG. 14 showing a perspective view exploded. In these FIGURES, the following numerals represent the following elements: 15 denotes a speaker unit for generating sound wave, 16 an acoustic pipe coupled in the front of speaker unit 15, 17*a* a screw for coupling and fixing speaker unit 15 and acoustic pipe 16 together, 17 a sound path within acoustic pipe through which the sound wave proceeds, 18 a reflector board provided at both sides for guiding a sound wave generated by speaker unit 15 to an opening 16*a* of acoustic pipe 16, 19 an absorber disposed within a throat section 22, 20 an absorber inserted from opening 16*a*, 21 a bonding agent for fixing the absorber inserted from said opening 16*a* to acoustic pipe 16, 22 denotes a throat section having its opening facing to a sound path 17 along which the absorber 20 is to be inserted, and 23 an absorber cover for sealing a throat section 22 after disposing absorber 19, and 24 a screw for fixing the cover.

Symbol "a" indicates a radiation sound wave on the front side of a television set radiated from opening 16*a* of acoustic pipe 16, and symbol "B" represents a radiation sound wave of the back side of a television receiver radiated from the back of speaker unit 15.

The speaker system as described above operates in the same way as the prior art shown in FIG. 11, therefore the operational description is eliminated here. Accordingly, the following description is made on the operation for absorbing different standing waves. The standing wave (which arises according to a length specific to the acoustic pipe 16 out of a sound wave generated from the speaker unit 15 and renders the speaker system to be one having frequency characteristics of turbulent peaks and dips) can be absorbed and suppressed by the absorber 19 of the throat section 22 and the absorber 20 inserted from opening 16*a* within acoustic pipe 16. Thus, the flat frequency characteristics are obtainable.

In order to bring the absorber 19 of the throat section 22 to a full functioning operation, the throat section 22 is sealed with absorber cover 23 and fixed with a screw 24. Further, the reflector board 18 is disposed at both sides in order for a sound wave not to be directly absorbed and damped at throat section 22. This functions to a certain extent to control and guide the sound wave, which works for the compensation of, among others, midrange frequency characteristics. By taking advantage of this characteristic, the reproduction of natural sound is made possible even in a speaker system comprising an acoustic pipe 16 constituted to have an opening of oblong, approximately rectangle shape, and placed in a television receiver set employing the same speaker system.

However, in a prior art speaker system constituted in a way as shown in FIGS. 11 and 12, where the peak at mid-range frequency is removed by providing the resonance absorption section 10 for absorbing the peak part, the absorbed part turns out to be "a big dip." This makes the response frequency characteristics curve to have turbulent peaks and dips as indicated with numeral 53 in FIG. 4. As a result, the speech articulation deteriorates.

In a prior art constitution, as shown in FIGS. 13 and 14, the sound wave is absorbed and damped by absorber 19 of the throat section 22 and by an absorber 20 inserted from the opening 16A. To the extent more change than what is needed, the level of frequency characteristics substantially drops to a level as indicated with numeral 51 in FIG. 7. As a result, the radiation volume of radiation sound wave of back side B becomes even larger than that of radiation sound wave of front side "a," in FIG. 13, bringing about a deteriorated speech articulation.

SUMMARY OF THE INVENTION

The present invention solves the above described drawbacks in the prior art, and aims to improve speech articulation by offering a speaker system of excellent sound reproduction with flat response frequency characteristics.

In order to solve these tasks, a speaker system according to the present invention comprises an acoustic pipe for guiding a sound wave, which is coupled to the front of a speaker unit. The opening of the duct has an oblong, approximately rectangle, shape, which acoustic pipe forms a sound path within the acoustic pipe for guiding a sound wave radiated from said speaker to the opening. A resonance absorption section comprises a tube with a hole for absorbing sound as its one end and a cavity coupled through with the other end of the tube, and a cover for covering the resonance absorption section, while providing a small gap linking the inside/outside of the acoustic pipe.

With the above described constitution, an excellent speaker system having improved speech articulation with flat response frequency characteristics is implemented by making use of the small gap formed in the cavity of a resonance absorption section. Even among the speaker system comprising a horn or an acoustic pipe whose opening is constituted to have an oblong rectangle shape to be suitable for installation in equipments, the present invention can suppress the peaks and dips through the control of the width of the band to be absorbed and the Q of dip.

DETAILED DESCRIPTION OF THE INVENTION

The following description describes various embodiments of the present invention with reference to FIG. 1 through FIG. 9.

Embodiment 1

Figure 1:
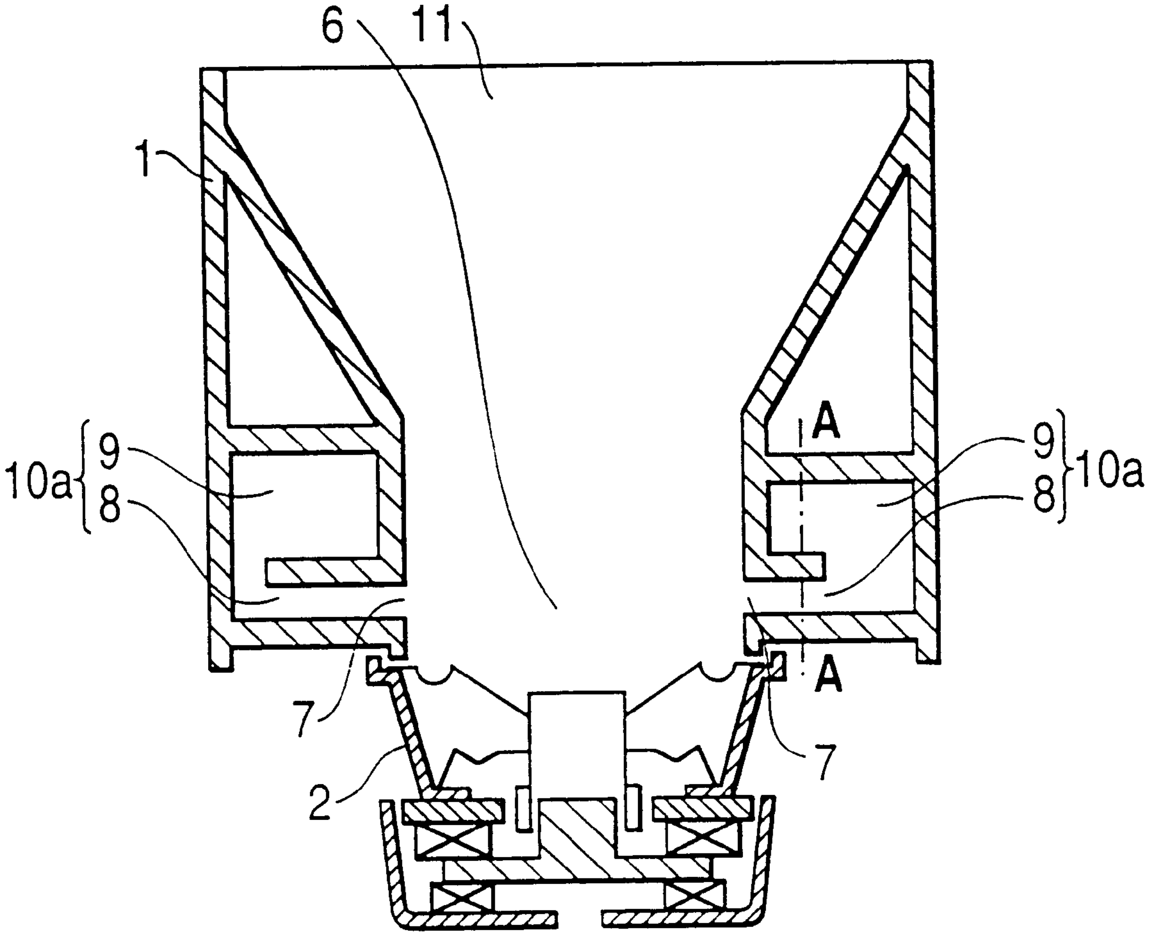
FIG. 1 A cross sectional side view of a speaker system according to an embodiment of the present invention.
Figure 2:
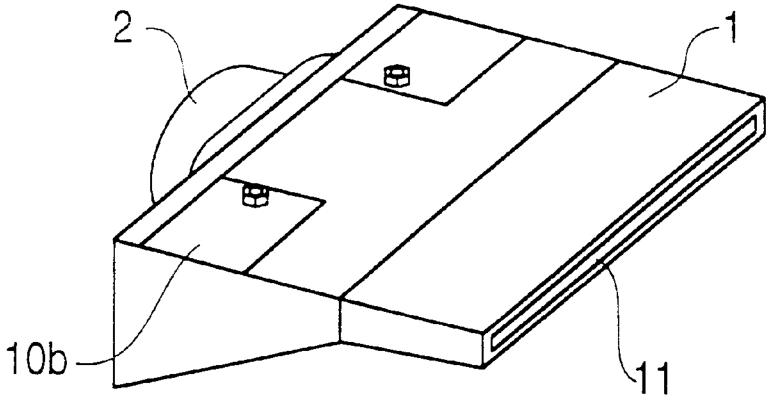
FIG. 2 A perspective view of the speaker system of FIG. 1.
Figure 3:
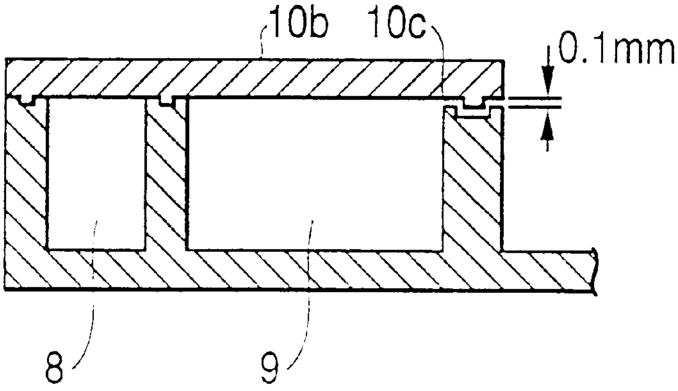
FIG. 3 A cross sectional view along A—A of FIG. 1.
Figure 11:
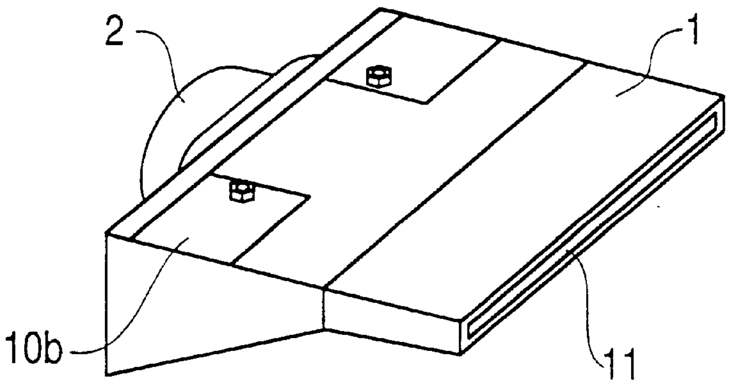
FIG. 11 (PRIOR ART)
FIG. 11 A Perspective view of the prior art speaker system.
Figure 12:
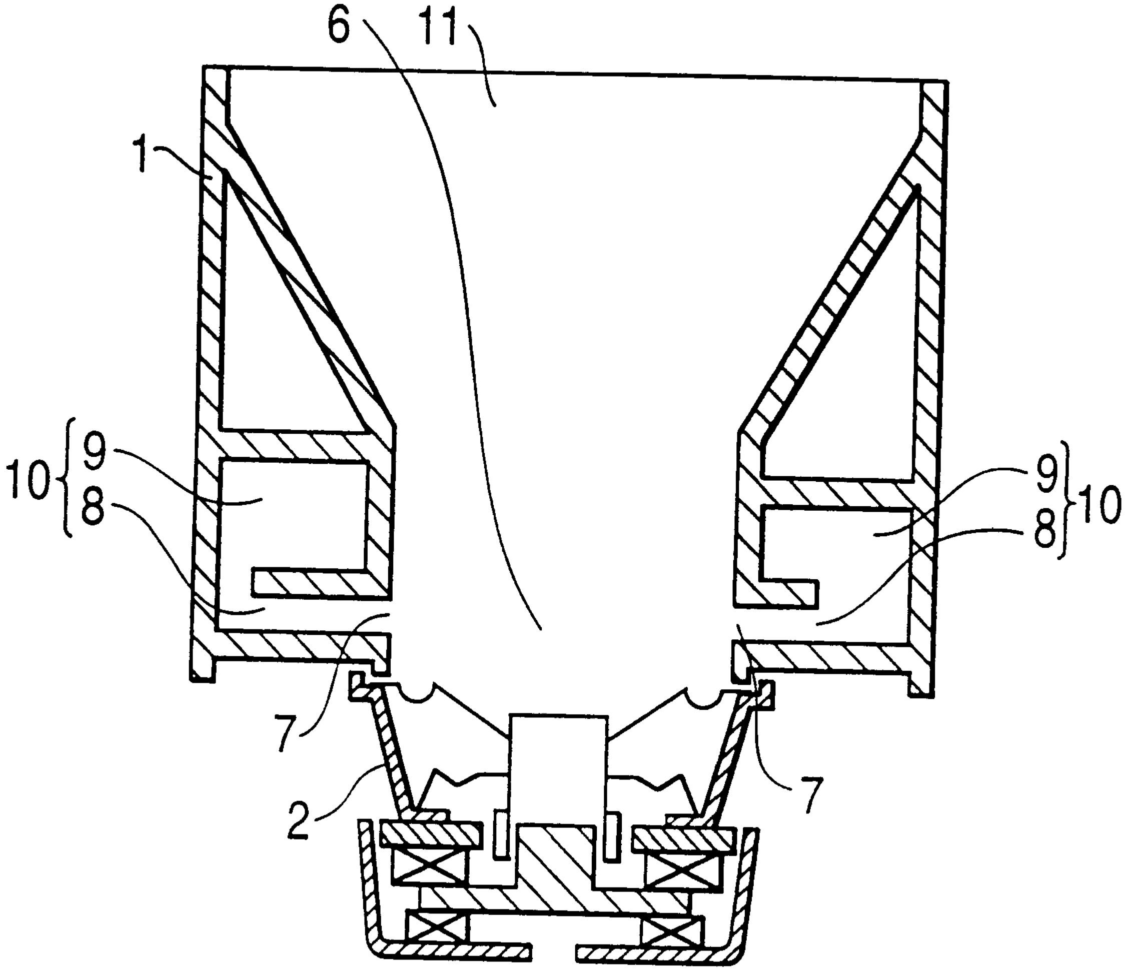
FIG. 12 (PRIOR ART)
FIG. 12 A cross sectional side view of the prior art speaker system.

FIG. 1 illustrates a cross sectional side view of a speaker system according to Embodiment 1 of the present invention, and FIG. 2 illustrates a perspective view of the speaker system of Embodiment 1. The external appearance of Embodiment 1 remains the same as that of the prior art as shown in FIG. 11. FIG. 3 illustrates a cross sectional view along line A—A of FIG. 1, showing the details of the resonance absorption section. The constituent components that have the same function as those of the prior art speaker system illustrated in FIGS. 11 and 12 are given the same reference symbols as the corresponding components in FIGS. 11 and 12, and the explanation of such components is as described above.

In Embodiment 1, an acoustic pipe 1 is coupled to the front of a speaker unit 2. Inside the acoustic pipe 1, a sound path 6 is formed for guiding a sound wave radiated from the speaker unit 2 to an opening 11. A resonance absorption section 10*a* is formed by a tube 8 with a hole 7 at one end for absorption of sound, and a cavity 9 coupled to the other end. As shown in FIG. 2, the resonance absorption section 10*a* is coupled with a cover 10*b* to form the resonance absorption section 10.

FIG. 3 illustrates a cross section along line A—A of FIG. 1, which shows the resonance absorption section 10*a* in detail. A small gap 10*c*, having approximately 0.1 mm of clearance, is disposed along the edge of the cover 10*b* for linking the cavity 9 to the outside of the acoustic pipe 1. Therefore, the cavity 9 is not completely sealed by the cover 10*b*. The small gap 10*c* may be provided for a desired length along the edge of cover 10*b*, relating to the gap clearance. Alternatively, the same effect is obtainable by providing a slit or a small hole in the cover 10*b*. The use of the term "small gap" is intended to cover such a slit or small hole.

The following describes the operation of a speaker system of Embodiment 1, as set forth above. When an input signal is applied to the speaker unit 2, sound wave(s) proceed through the sound path inside of the acoustic pipe 1 and radiate from the opening 11. Meanwhile, a standing wave is created in the inside of the acoustic pipe 1 and is taken into the cavity 9 from the hole 7 provided for sound absorption, via the tube 8. The width of the band to be absorbed and the Q of the dip can be controlled by adjusting the air pressure within the cavity 9 by making use of the air escaping through the small gap 10*c*, and the peaks and dips are thereby suppressed to the response frequency characteristics curve as indicated by reference numeral 52 in FIG. 4.

Figure 4:
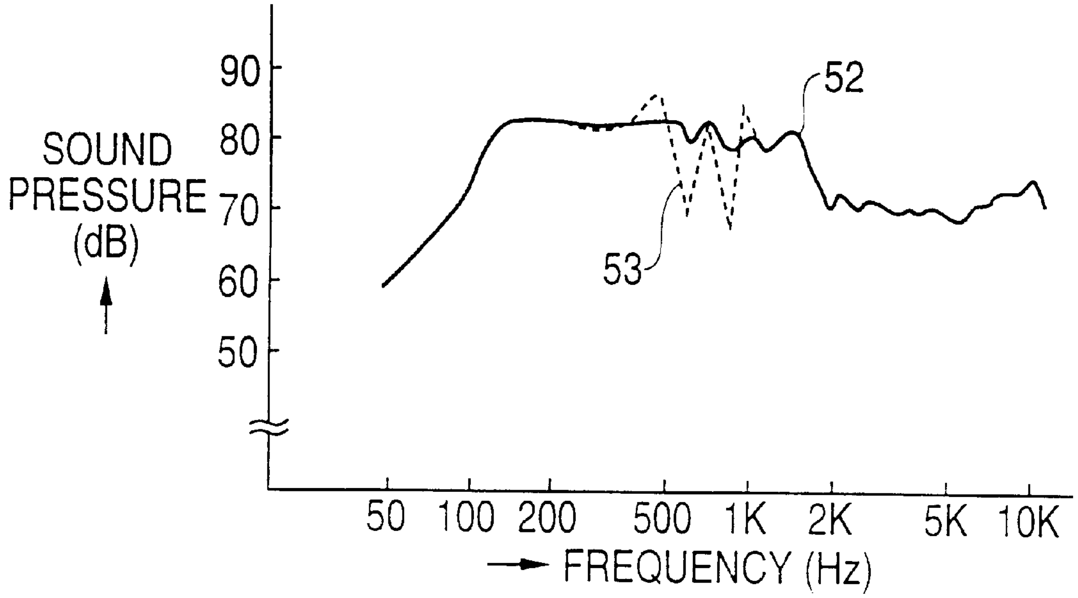
FIG. 4 The response frequency characteristics chart of a speaker system according to an embodiment of the present invention.

As seen from FIG. 4, the present Embodiment is capable of suppressing the peaks and dips of midrange frequency which improves the speech articulation and provides a speaker system having excellent sound reproduction of flat response frequency characteristics.

By assembling visual equipment with a speaker system of the present invention, the size of the visual equipment can be made small and slim, while providing high performance characteristics and quality sound.

The same effect is of course obtained when a back cabinet, a bass reflector, such as a port, etc., is additionally provided in a speaker system according to the present invention with the acoustic pipe 1.

Although in Embodiment 1 the gap 10*c* is made to have approximately 0.1 mm of clearance, any small gap is acceptable in so far as it serves for suppressing the peaks and/or dips. The clearance may be increased or decreased depending on the needs, or may be determined in relation to the gap length and the effects.

The above description has been made on an assumption that there is only one resonance absorption section 10*a*. However, if more than two of such sections are provided, each having a different length of the tube 8 and a different cavity 9, then a flatter response frequency characteristics curve is obtainable.

Embodiment 2

Figure 5:
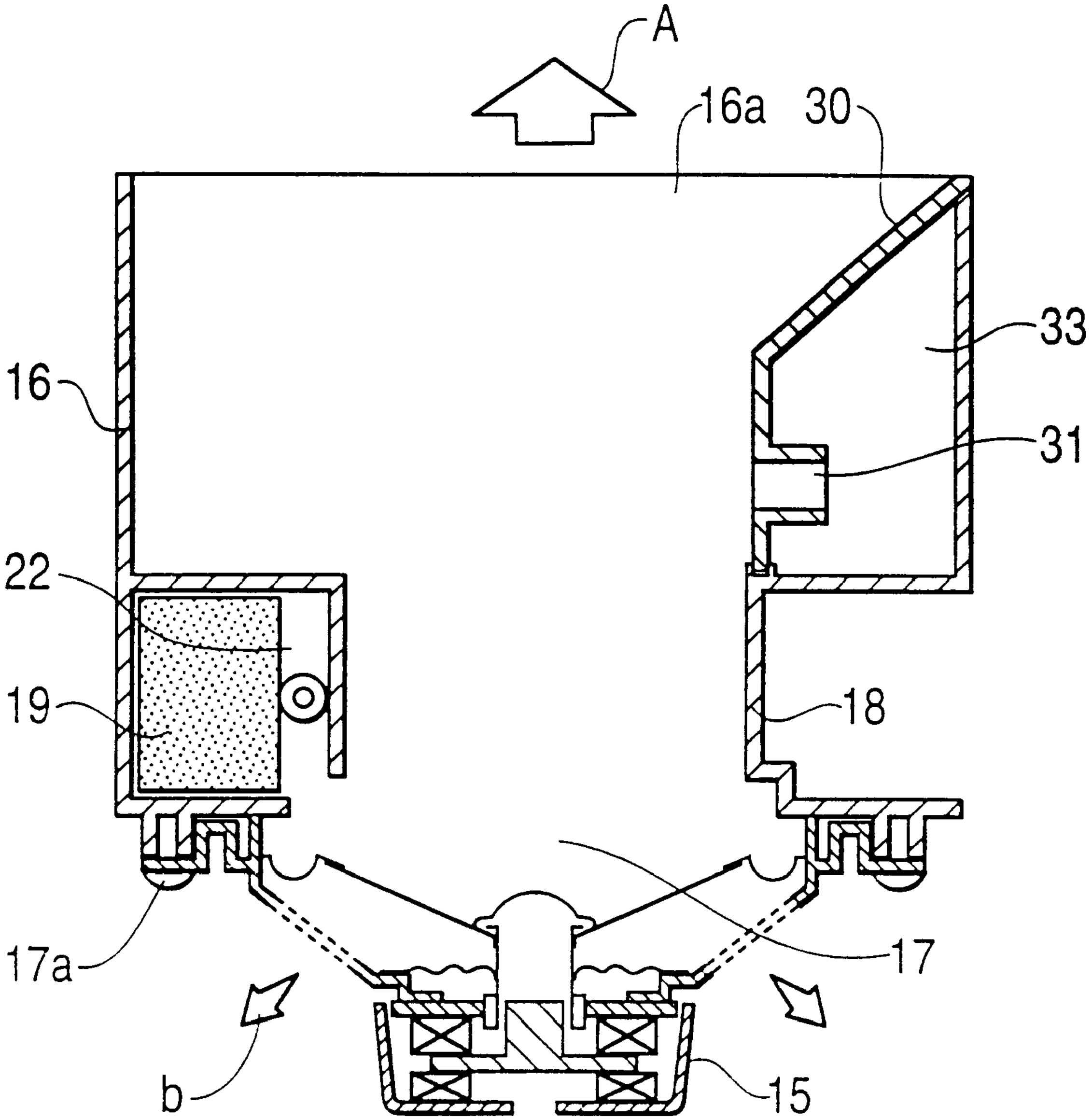
FIG. 5 A cross sectional side view of a speaker system according to other embodiment of the present invention.
Figure 6:
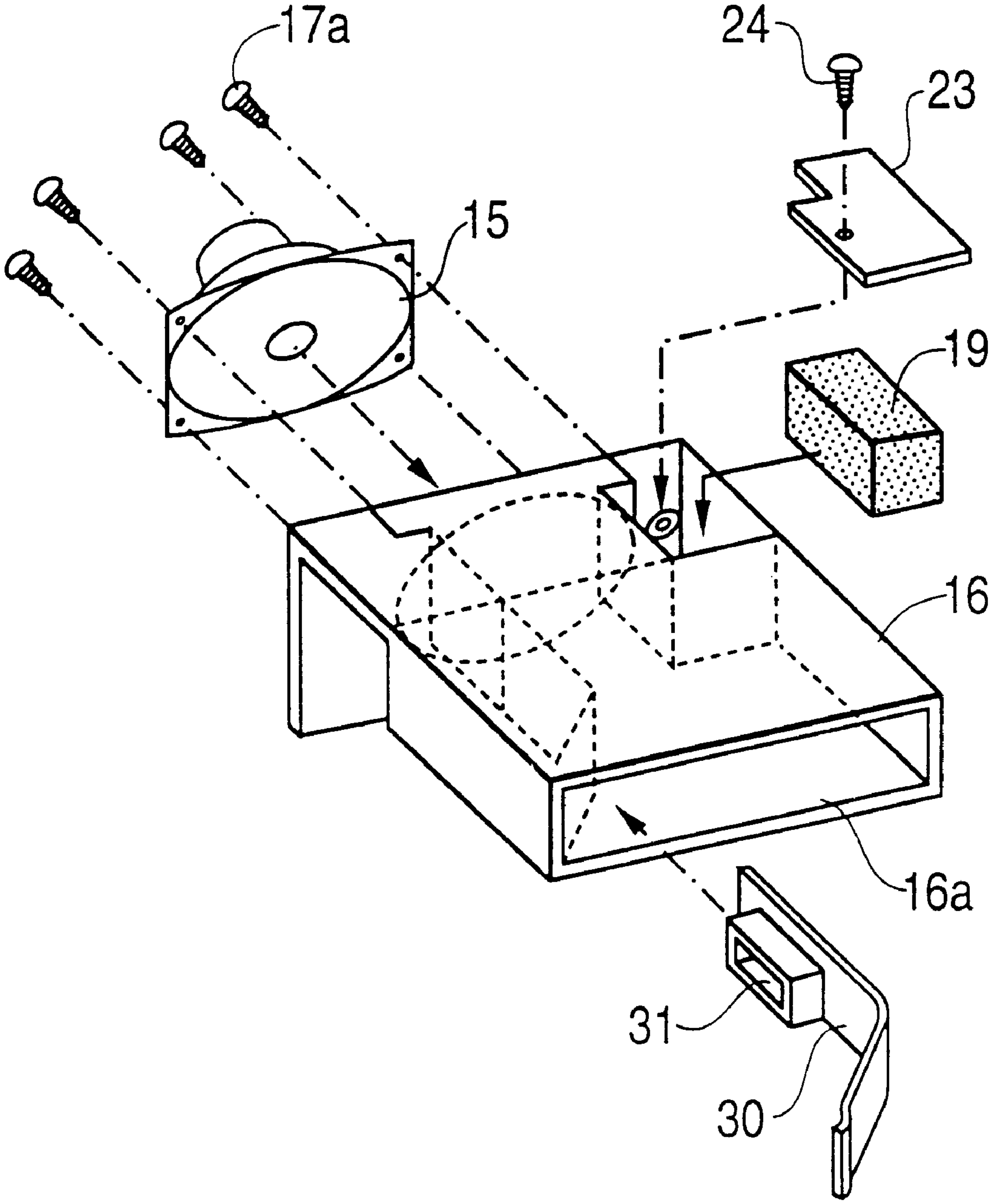
FIG. 6 An exploded perspective view of FIG. 5.
Figure 13:
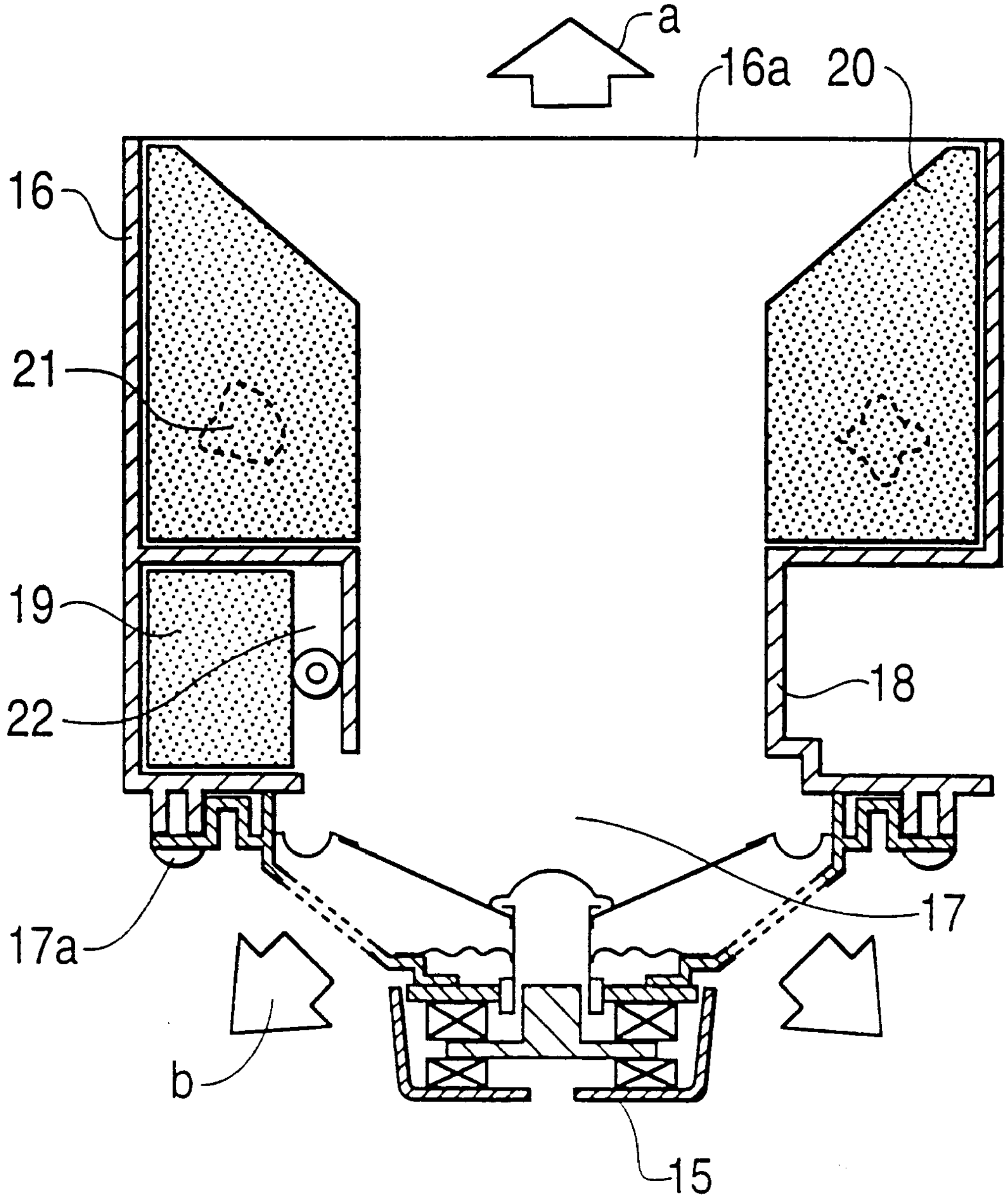
FIG. 13 (PRIOR ART)
FIG. 13 A cross sectional side view of other prior art speaker system.
Figure 14:
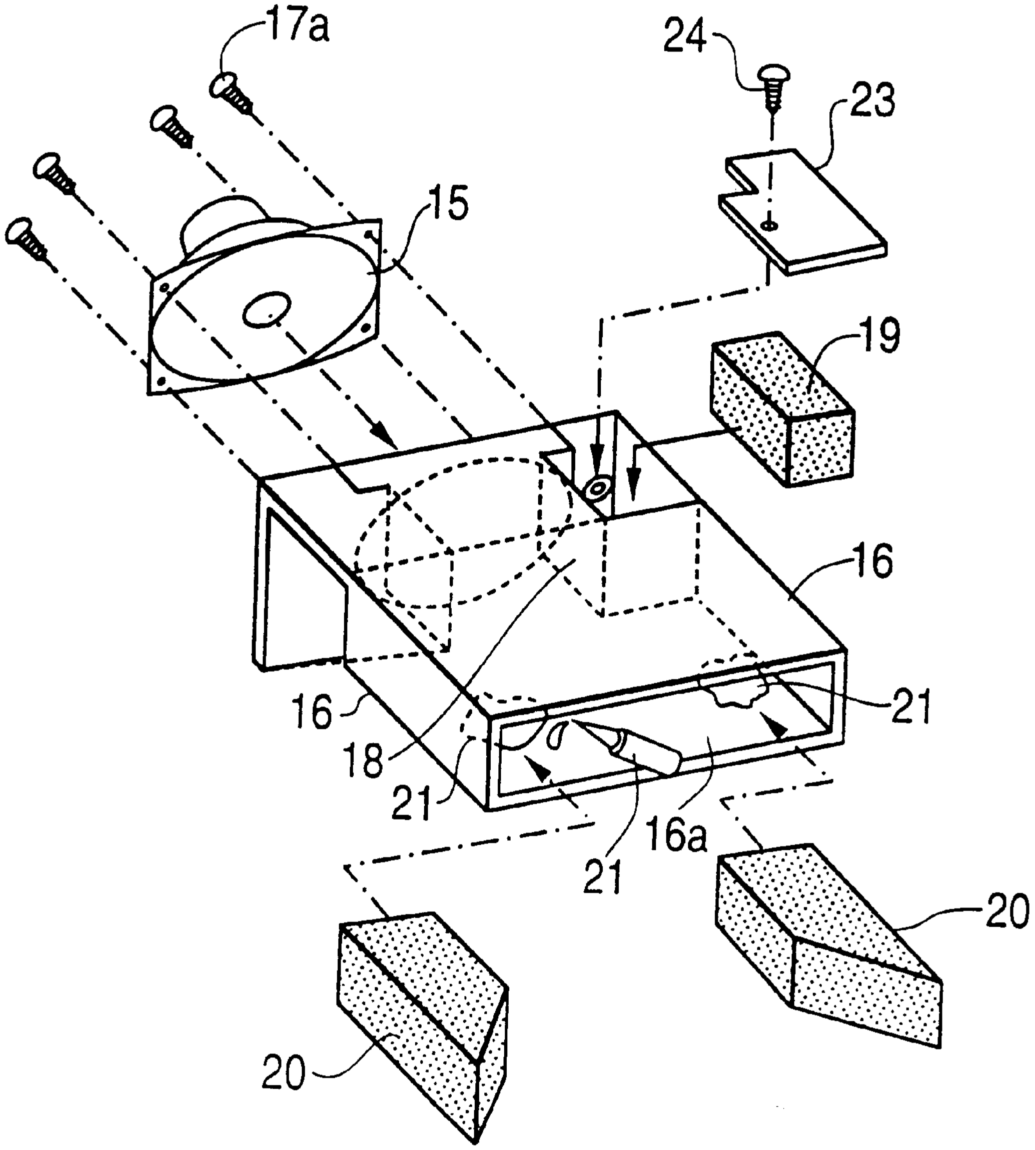
FIG. 14 (PRIOR ART)
FIG. 14 An exploded perspective view of FIG. 13.

FIG. 5 is a cross sectional side view of a speaker system according to Embodiment 2 of the present invention, and FIG. 6 is an exploded perspective view of the same. The constituent components which have the same function as those of the prior art speaker system illustrated in FIGS. 13 and 14 are given the same reference symbols as the corresponding components in FIGS. 13 and 14, and the explanation of such components is as described above.

Referring to FIG. 5, the acoustic pipe 16 is coupled to the front of the speaker unit 15 for guiding a sound wave through the opening of the acoustic pipe 16. The acoustic pipe 16 has an oblong, approximately rectangular shape. A first inserting partition 30 can be inserted into the acoustic pipe 16 from opening 16*a*. Reference numeral 30 denotes a first inserting partition, 31 denotes a port section of the first inserting partition 30, and 33 denotes a cavity of the first inserting partition.

When an electric signal is applied to speaker unit 15, the signal is converted to a sound signal and a sound wave is generated. The sound wave is guided to opening 16A through the sound path 17 by the acoustic pipe 16 and radiates a radiation sound wave of the front side A.

The first inserting partition 30 and the acoustic pipe 16 are integrated to form a structure and the port section of the first inserting partition 31 works as a short tube, which, together with the cavity of the first inserting partition 33 formed by the first inserting partition 30 and the acoustic pipe 16, plays a role of being a Helmholtz resonator in the acoustic pipe 16. Thus, the cavity of the first inserting partition 33 causes cavity resonance on a standing wave created inside of the acoustic pipe 16. The sound wave is thus not reduced to a loss. Accordingly, it is radiated as a radiation sound wave of the front side A, enabling the sound pressure to be maintained at a high level without causing a deterioration in the level of response frequency characteristics. The radiation sound wave of the front side A is radiated without loss and maintained without being set off by the radiation sound wave of the back side b, and the speech articulation is not ill affected. The present invention thereby overcomes disadvantages of the prior art and achieves improved speech articulation.

Figure 7:
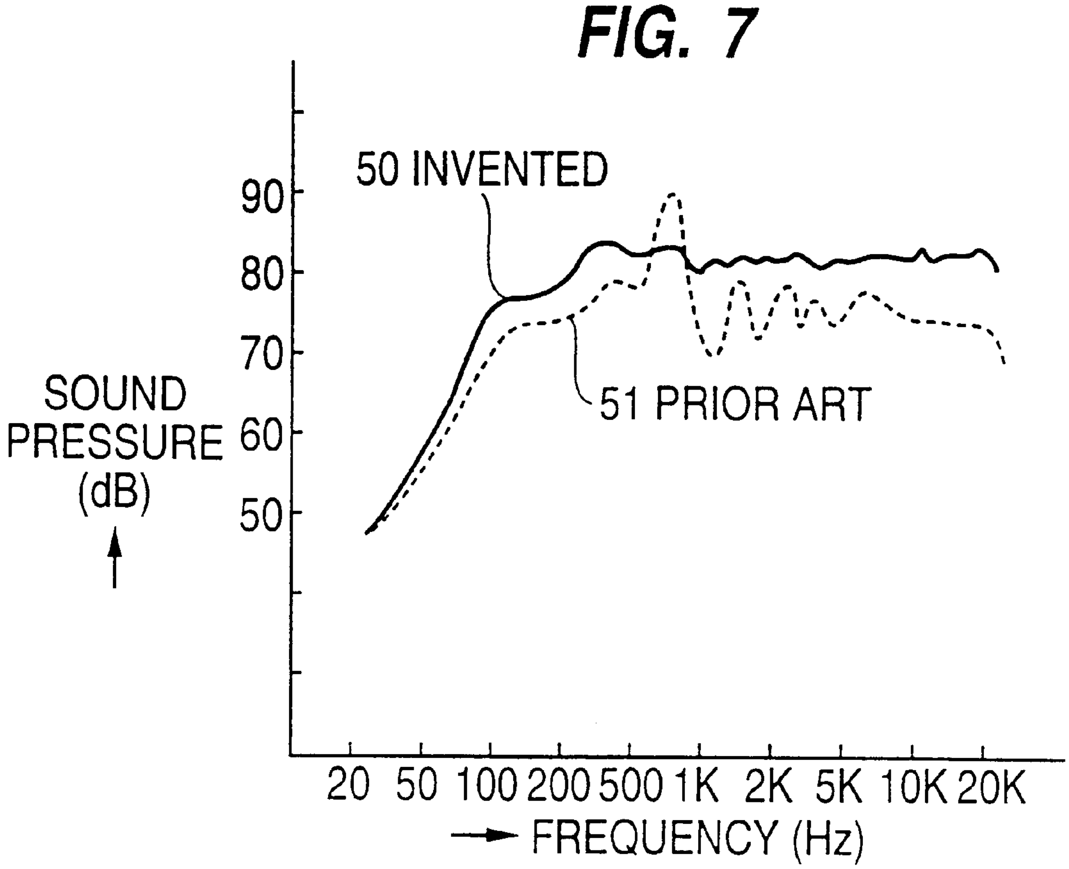
FIG. 7 The response frequency characteristics chart of a speaker system according to other embodiment of the present invention.

FIG. 7 compares the frequency characteristics 50 of a speaker system according to Embodiment 2 with the frequency characteristics 51 of a prior art speaker system. As FIG. 7 illustrates, the frequency characteristics 50 exhibit a flatter curve, without the turbulent peaks and dips at around 500 Hz. This is accomplished by the suppression of the primary resonance, achieved by the cavity of first inserting partition 33 formed by first inserting partition 30 and the acoustic pipe 16. Furthermore, because of the eliminated absorber, which used to be inserted from the front, the level of the entire frequency curve is raised, thereby making it possible to reproduce a sound of rich frequency characteristics with the feeling of abundant sound pressure.

The present invention, with the first inserting partition 30 separated from the acoustic pipe 16 as an independent component capable of being inserted from the front of the opening 16*a* of the acoustic pipe 16, allows a complete freedom in designing the shape of the first inserting partition 30 and port section of the first inserting partition 31. This makes it possible to put the turbulent peaks and dips caused by the actions of resonance occurring in a number of orders under full control, making it possible to freely modify the response frequency characteristics.

Further, as the radiation sound wave of front side A is radiated without loss, it is maintained without being set off by the radiation sound wave of the back side b, and without causing a decreased level. This enables the speaker system to reproduce a sound rich in the low region. In addition, as the volume of a radiation sound wave of the back side radiated in the inside of a back cabinet (not shown) decreases, the left side radiation sound wave of the back side, and the right side radiation sound wave of the back side, neither interfere with each other, nor affect the frequency characteristics. Thus, favorable response frequency characteristics are realized.

Furthermore, the structure allowing insertion of the acoustic pipe 16 through the front of opening 16*a* influences the resin mold component of the conventional acoustic pipe 1. As a result, a polystyrene material of low viscosity and low tenacity (with which material the shaping of a hinge structure is impossible) becomes usable, in addition to the widely used polypropylene material capable of shaping a hinge structure, which is an indispensable structure for housing and sealing in an absorber. This affords a wide range of acceptable materials, thus providing a wide degree of designing freedom in designing the structure of an acoustic pipe, which, in turn, increases the margin and the freedom of designing the sound quality for a speaker system.

By incorporating a speaker system according to the present Embodiment in a television receiver set, the television receiver set can be made small and slim-shaped, providing a high performance television receiver set with quality sound.

Embodiment 3

Figure 8:
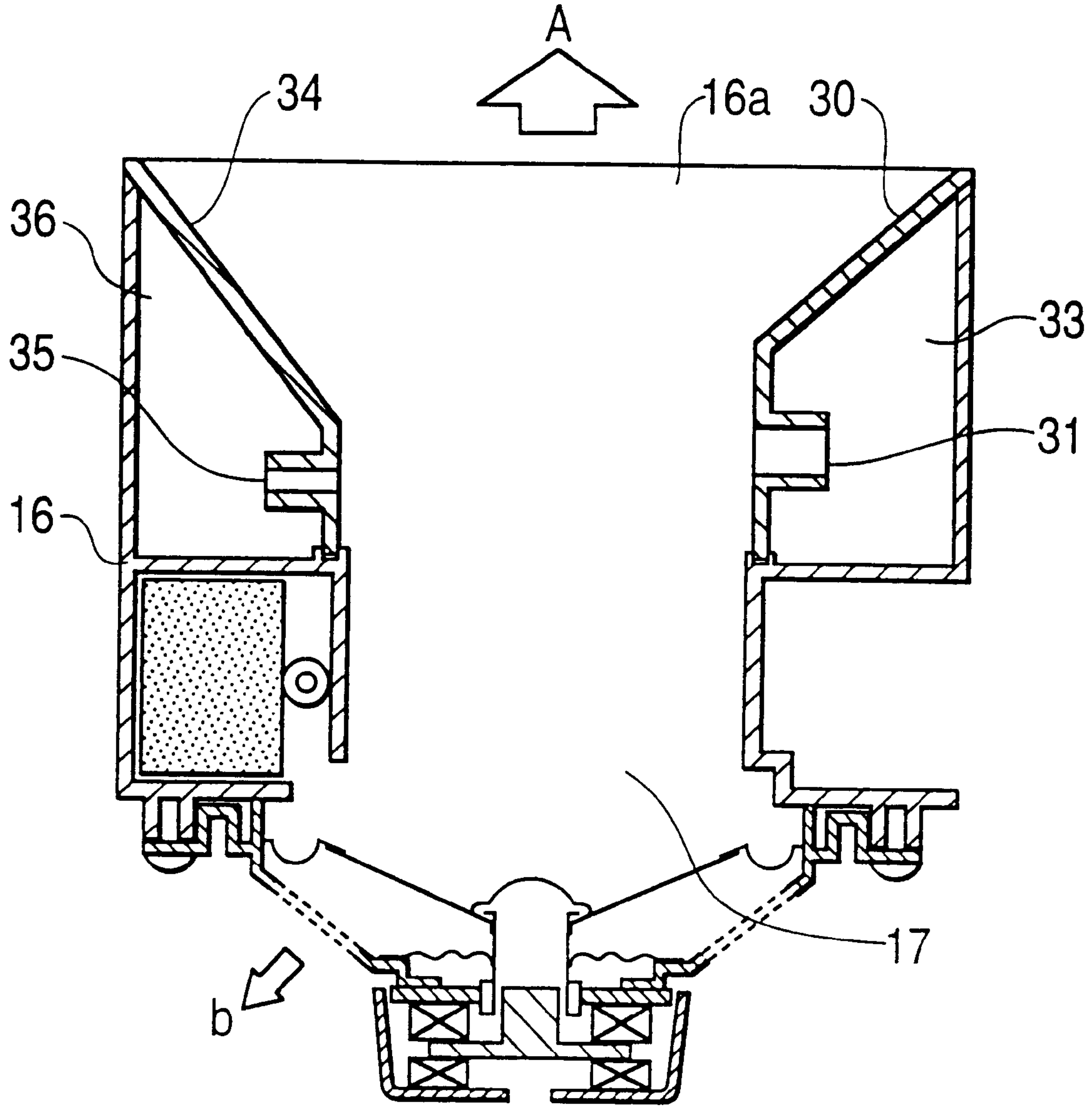
FIG. 8 A cross sectional side view of a speaker system according to other embodiment of the present invention.

FIG. 8 illustrates a cross sectional side view of a speaker system according to Embodiment 3 of the present invention. In FIG. 8, the reference numeral 30 denotes a first inserting partition, 31 denotes a port section of the first inserting partition, 33 denotes a cavity of the first inserting partition, 34 denotes a second inserting partition, 35 denotes a port section of the second inserting partition, and 36 denotes a cavity of the second inserting partition. Embodiment 3 differs from Embodiment 2 in that Embodiment 3 includes two inserting partitions 30 and 34 disposed in the inside of the acoustic pipe 16.

In Embodiment 3, the turbulent peaks and dips of resonance in the frequency characteristics are divided into finer sections so as to be able to distinguish the resonance of an even numbered order and that of an odd numbered order. The resonance of the even numbered order is assigned to the left inserting partition, for example, and that of the odd numbered order is assigned to the right inserting partition, and are suppressed separately by each of the Helmholtz resonators formed by the cavities of the respective inserting partitions. By controlling the frequency of the Helmholtz resonator, the turbulent peaks and dips can be suppressed by the two inserting partitions up to the high orders of resonance. The present invention thereby implements flatter frequency characteristics than those of the prior.

Embodiment 4

Figure 9:
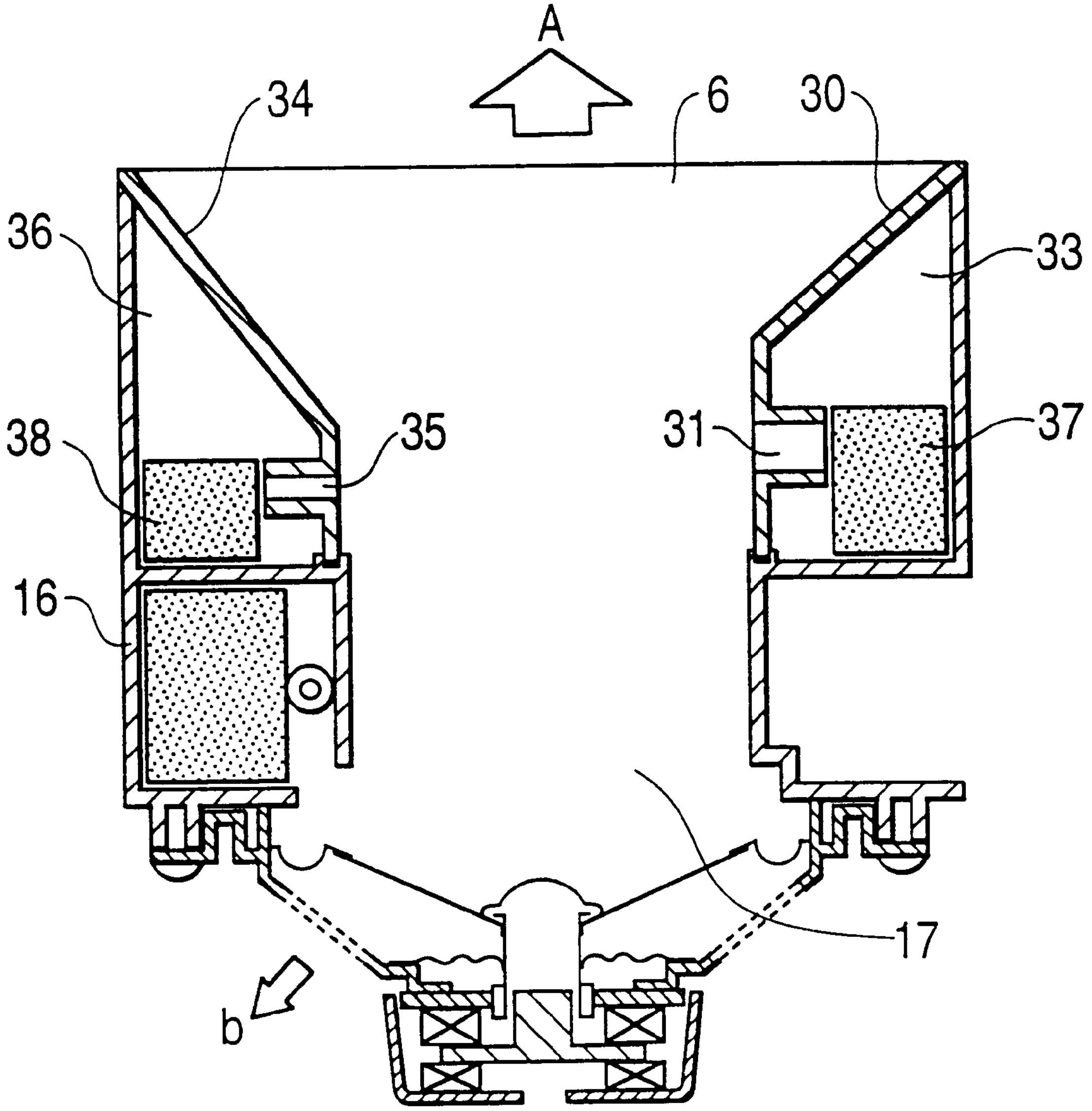
FIG. 9 A cross sectional side view of a speaker system according to other embodiment of the present invention.
Figure 10:
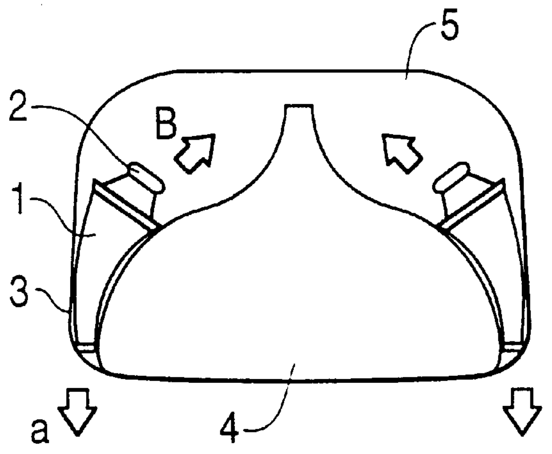
FIG. 10 (PRIOR ART)
FIG. 10 A conceptual structure of a television receiver using a prior art speaker system.

FIG. 9 illustrates a cross sectional side view of a speaker system according to Embodiment 4 of the present invention. In FIG. 9, reference numeral 37 denotes an absorber disposed in a cavity 33 of a first inserting partition, and 38 denotes an absorber disposed in a cavity 36 of a second inserting partition. Embodiment 4 differs from Embodiment 3 in that Embodiment 4 includes absorbers 37 and 38 disposed in the cavities 33 and 36, respectively.

In Embodiment 4, by including the absorbers 37 and 38, even a small and sharp peak or dip caused by the standing wave and/or cavity resonance is absorbed. This makes it possible to subtly control or give flavor to what has never before been represented in the response frequency characteristics.

Further, Embodiment 4 radiates a sound wave as a radiation sound wave of the front side A from the opening 16*a* of the acoustic pipe without causing any absorption or damping. This occurs because the absorbers disposed in the inside of the inserting partitions are not exposed to the sound path 17 through which the sound wave proceeds, and thus does deteriorate the level of sound pressure.

Also, the same concept may be applied to the cavity in which an absorber 19 of the throat section 22 is to be disposed, as illustrated in FIG. 5, by inserting a partition from the back of the acoustic pipe 16, or from the side of the speaker unit 15. This achieves the same results and performance as described above.

As described above, a speaker system according to the present invention implements the flat response frequency characteristics where the peaks and dips are least contained in the mid-range frequency, which is an important range for reproducing the human voice. In this way, the present invention realizes excellent speech articulation with favorable acoustic characteristics which the prior art technology fails to attain.

What is claimed:

1. A speaker system comprising:

an acoustic pipe, said acoustic pipe having an approximately rectangular shaped opening coupled to a front of a speaker unit, wherein the acoustic pipe guides a sound wave radiated from said speaker unit along a sound path;

a resonance absorption section comprising a tube and a cavity, one end of said tube having a hole for absorbing sound, said hole facing the sound path, and said cavity coupled with the other end of the tube; and a cover for covering the resonance absorption section, said cover defining a small opening into said resonance absorption section; and wherein said speaker system being coupled with a television receiver.

2. The speaker system according to claim 1, comprising at least two resonance absorption sections, each resonance absorption section having a tube with length and cavity volumes that differ from one another.

3. The speaker system of either of claims 1 and 2, wherein the small opening is approximately 0.1 mm.

4. A method of providing a speaker system with improved response frequency characteristics and the speech articulation, said method comprising the steps of:

forming an acoustic pipe for guiding a sound wave, said acoustic pipe having an oblong, approximately rectangle shape opening coupled to a front of a speaker unit, providing a sound path formed inside the acoustic pipe so as to guide the sound wave radiated from said speaker unit to the opening;

resonantly absorbing the sound wave by providing a resonance absorption section comprising a tube and a cavity, one end of said tube comprising a hole for absorbing sound, said hole facing the sound path, and said cavity coupled with the other end of the tube; and suppressing peaks and dips of the sound wave by providing a cover for covering the resonance absorption section, said cover defining a small gap so as to enable an opening between said resonance absorption section and the outside of the acoustic pipe.

* * * * *